United States Patent [19]

Chan et al.

[11] Patent Number: 5,301,124
[45] Date of Patent: Apr. 5, 1994

[54] REGISTRATION OF PATTERNS FORMED OF MULTIPLE FIELDS

[75] Inventors: Ken T. Chan, Wappingers Falls; Donald E. Davis, Poughkeepsie; William A. Enichen, Poughkeepsie; Cecil T. Ho, Poughkeepsie; Edward V. Weber, Poughkeepsie; Guenther Langner, Glen, all of N.Y.

[73] Assignee: International Business Machines Corporation, Armonk, N.Y.

[21] Appl. No.: 118,984

[22] Filed: Sep. 9, 1993

Related U.S. Application Data

[63] Continuation of Ser. No. 743,438, Aug. 9, 1991, abandoned.

[51] Int. Cl.⁵ .......................... G06F 15/00; G01J 1/00; A61N 5/00
[52] U.S. Cl. ............................... 364/490; 250/491.1; 250/492.2; 436/518; 364/491; 364/489
[58] Field of Search ............... 364/490, 491, 489; 250/491.1, 492.2; 436/518; 156/643; 355/53

[56] References Cited

U.S. PATENT DOCUMENTS

| | | | |
|---|---|---|---|
| 3,900,736 | 8/1975 | Michail et al. | 250/492 A |
| 4,322,626 | 3/1982 | Kawashima | 250/492.2 |
| 4,334,156 | 6/1982 | Bohlen et al. | 250/491 |
| 4,390,788 | 6/1928 | Hayashi et al. | 250/491.1 |
| 4,413,186 | 11/1983 | Uema | 250/491.1 |
| 4,430,571 | 2/1984 | Smith et al. | 250/492.2 |
| 4,467,211 | 8/1984 | Smith et al. | 250/492.2 |
| 4,468,565 | 8/1984 | Blair et al. | 250/491.1 |
| 4,472,824 | 9/1984 | Buckley | 250/491.1 |
| 4,489,241 | 12/1984 | Matsuda et al. | 250/491.1 |
| 4,500,790 | 2/1985 | Bretscher et al. | 250/492.2 |
| 4,538,069 | 8/1985 | Shambroom et al. | 250/491.1 |
| 4,728,799 | 3/1988 | Gordon et al. | 250/492.2 |
| 4,789,945 | 12/1988 | Niijima | 364/490 |
| 4,812,661 | 3/1989 | Owen | 250/491.1 |
| 4,818,885 | 4/1989 | Davis et al. | 250/492.2 |
| 4,945,246 | 7/1990 | Davis et al. | 250/492.2 |
| 5,043,586 | 8/1991 | Giuffre et al. | 250/491.1 |
| 5,140,366 | 8/1992 | Shiozawa et al. | 355/53 |
| 5,143,854 | 9/1992 | Pirrung et al. | 436/518 |
| 5,169,488 | 12/1992 | Giuffre et al. | 156/643 |

OTHER PUBLICATIONS

D. E. Davis, Stiching Technique for Electron-Beam Lithography System, IBM Technical Disclosure Bulletin, vol. 21, No. 5, Oct. 1978.
D. E. Davis, Field stitching Method, IBM Technical Disclosure Bulletin, vol. 22, No. 1, Jun. 1979.

*Primary Examiner*—Thomas G. Black
*Assistant Examiner*—Jacques H. Louis-Jacques
*Attorney, Agent, or Firm*—Whitham & Marhoefer

[57] ABSTRACT

A pattern is aligned and exposed with a lithography system so that chips larger than the deflection field can be formed by exposing M×N fields in a mosaic pattern. The method corrects the deflection field to compensate for the orientation of a previous pattern on a substrate and compensates for errors due to height caused by the beam landing non perpendicular to the target. Two basic procedures disclosed are called "3-mark" which are only applicable to 2×2 arrays of fields, and "M×N" which covers the general situation, but with slightly less accuracy.

9 Claims, 3 Drawing Sheets

REGISTRATION OF PATTERNS FORMED OF MULTIPLE FIELDS

CROSS-REFERENCE TO RELATED APPLICATION

This application is a continuation of application Ser. No. 07/743,438 filed Aug. 9, 1991, now abandoned.

BACKGROUND OF THE INVENTION

1. Field of the Invention

The present invention generally relates to lithography tools for the manufacture of integrated circuits (ICs) and, more particularly, to the alignment and stitching of fields in a lithographic exposure system where there are locations at which alignment marks have been omitted intentionally or cannot be located on the substrate.

2. Description of the Prior Art

Lithography systems have been used to expose patterns on semiconductor wafers in the fabrication of large-scale integrated (LSI) circuits. Unfortunately, many lithography tools have a field size limited to less than the largest IC chips to be written. This is inconvenient for device designers because they prefer not to expend the extra effort to subdivide chips into field size components. Therefore, it is useful to join or "stitch" fields with sufficient accuracy that the assembly appears essentially as one large field. This is increasingly a problem with very large scale integration (VLSI) and wafer scale integration (WSI).

Electron (E)-beam, ion beam and some optical steppers are examples of tools which must "stitch" fields together to expose the larger chips which will be required in the future. Prior techniques for stitching fields together in E-beam systems are described, for example, by Donald E. Davis in "Stitching Technique for Electron-Beam Lithography System", *IBM Technical Disclosure Bulletin*, vol. 21, no. 5, October, 1978, pp. 1875 and 1876, and in "Field Stitching Method", *IBM Technical Disclosure Bulletin*, vol. 22, no. 1, June, 1979, pp. 114 and 115. The first of these techniques takes advantage of the fact that image quality is primarily restricted to radial distance. Thus, if the field size is reconfigured to a small dimension in one axis, the other dimension can be expanded. Unfortunately, this technique is limited to chips which have their short dimension less than the square root of two times the maximum square chip. The second technique described by Davis takes advantage of the fact that image quality of the registration beam can be significantly degraded from that required for pattern writing without a serious impact on mark detection. By making a field range three times the writing range, marks at the chip perimeter can be detected and used to register the "writing quality" central portion of the field. The requirement for a deflection range one and a half times the chip size limits potential chip size and also degrades accuracy because deflection errors increase with range.

U.S. Pat. No. 4,489,241 to Matsuda et al. for "Exposure Method with Electron Beam Apparatus" and U.S. Pat. No. 4,789,945 to Niijima for "Method and Apparatus for Charged Particle Beam Exposure" disclose two other techniques for stitching fields. The Matsuda et al. technique divides areas of a wafer into sub sections for the purpose of reducing the volume of pattern information which must be contained in the tool memory at any instant and/or for the purpose of reducing the number of registration marks which must be scanned. While this technique eliminates some of the multi-field writing problems by adjusting for writing plane deviations via beam focus and repositioning the exposure field center based on height measurements, the block size and field size which can be used are restricted because in-field distortions are not well corrected. The Niijima technique divides a semiconductor chips into blocks and adjusts the block patterns based on marks in the four corners. Some of the four marks may be imaginary and are calculated from the real marks. This technique also does not correct for in-field errors caused by target plane errors and so is limited in accuracy or field size.

The following describes the problems in terms of an electron beam system; however, it will be understood that the situation is similar for other tools as well. In electron beam lithography, when the beam does not land perpendicular to the target, it will be displaced from its intended position when the height of the target is not nominal. Target heights generally vary due to manufacturing tolerances and distortions caused by hot processing. For an electron beam deflection with the apparent rocking point not at an infinite distance from the target the beam will land at an increasing angle from perpendicular as it is deflected which produces an increasing error. When the target is tilted and the corners of the fields are adjusted to match the desired positions by application of the usual linear corrections (i.e., $A+Bx+Cy+Dxy$), there will be an error at internal points which can be corrected by the addition of $x^2$ and $y^2$ terms.

There are three categories of problems. First, the axes of previous level patterns which are to be overlaid may be translated and/or rotated from the axes of the exposure tool. Second, the patterns may have some degree of distortion caused by the previous level of exposure, subsequent processing, or distortions of the writing tool. Third, the current exposure may have additional distortions of the exposure beam position over portions of the field.

In the single field/chip situation, errors due to the first category and the linear portion of the second category are typically corrected by detecting registration marks in a previous level pattern at the four corners of the field and "stretching" the current field to match the observed mark locations. Errors due to the third category are typically compensated by adjusting the field to correct for expected distortions. The magnitude of distortions can be extrapolated from corner errors, height information, and knowledge of deflection geometry. Registration marks in the interior of the chip are highly undesirable because they create forbidden areas which can not be used for circuits and devices and may disrupt the regularity of large area designs; therefore, four marks may not be available at the field corners to correct individual fields of a multi-field chip.

SUMMARY OF THE INVENTION

It is therefore an object of the present invention to provide a method for compensating for height errors while stitching fields in writing patterns on chips.

It is another object of the invention to provide a lithography system that permits forming a mosaic of as many fields as needed, with the flexibility to adjust field size to accommodate resolution and accuracy requirements.

It is yet another object of the invention to eliminate low throughput caused by restriction to small field sizes in order to accommodate errors caused by non-perpendicular radiation incident upon a target.

According to the invention, there are provided techniques for alignment and error correction when there is missing corner information. There are two basic methods one of which is called "3-mark" which is only applicable to $2 \times 2$ arrays of fields, the other one is "$M \times N$" which covers the general situation, but with slightly less accuracy.

The more general $M \times N$ method is as follows:

1. The deflection field is calibrated to eliminate relative placement errors of points in the field at a known height.
2. The substrate or target is sequentially positioned to three or more alignment marks associated with the previous level pattern on the substrate such that each alignment mark can be scanned using a small deflection at the center of the exposure field so as to eliminate positional errors due to height. The substrate height is also measured at three or more locations in the vicinity of the previous level pattern(s).
3. An analytical description of the alignment mark positions associated with the previous level pattern(s) is calculated.
4. An analytical description of the surface of the previous pattern(s) is calculated from the height measurements.
5. The locations of the corners of the exposure field are calculated based upon the analytical description determined in step 3.
6. The heights of the surface(s) of the previous pattern(s), relative to the reference grid, at the corners of the exposure field(s) are then calculated from the analytical expression obtained in step 4.
7. The exposure field corner locations from step 5 are modified by the height difference from step 6 and used to form corrections to the exposure field so that the exposure field will overlay the previous pattern on the substrate.
8. The substrate is sequentially positioned and fields exposed until all $M \times N$ fields have exposed the substrate.
9. Steps 2 through 8 are repeated until the entire substrate has been exposed.

In the 3-mark method, steps 1 through 7 are similar to the first method. The substrate is sequentially positioned to expected exposure locations. Prior to exposure, alignment marks which may exist within scanning reach are scanned to obtain a more accurate identification of the desired position of the exposure field. The scan field modifications from step 7 are recalculated using actual data for those field corners where marks exist. The field is then exposed with the more accurate corrections. Steps 2 though 8 are repeated until the entire substrate has been exposed. The process according to the invention, whether the "3-mark" or more general $M \times N$ method, is implemented as a control program in a computer controlled lithography system, modified to include a height sensing system for making the height measurements.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
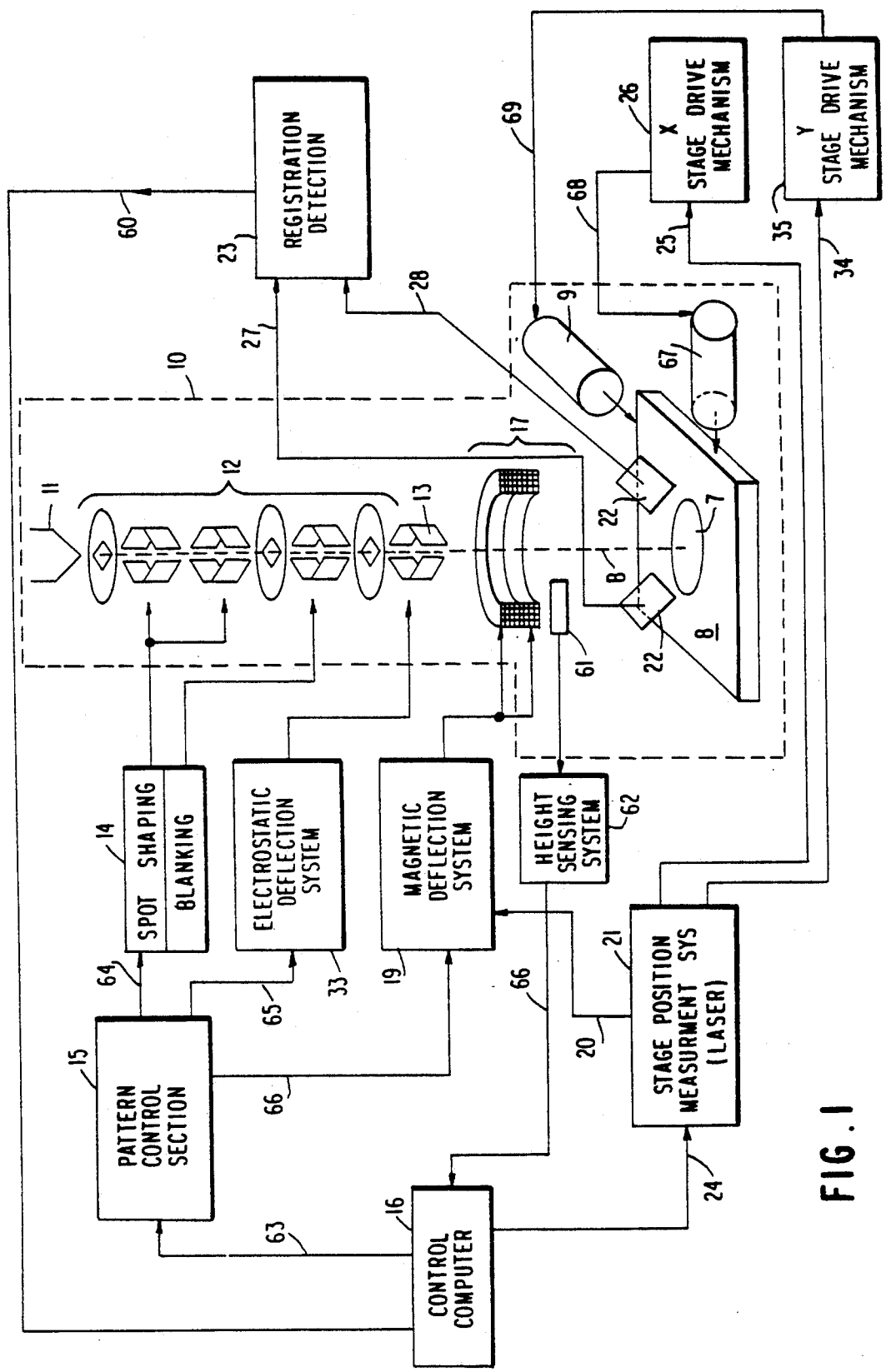
FIG. 1 is a block diagram of the electron beam exposure system according to a preferred embodiment of the invention.

Referring now to the drawings, and more particularly to FIG. 1, there is shown a preferred embodiment of the invention. An X-Y work table 8 is moved beneath an electron beam B. The work table 8 carries a target 7, which is typically a semiconductor substrate. In the preferred embodiment of the invention, the X-Y work table 8 is a high precision table equivalent to a mask maker quality stepping table. As will be better understood hereinafter, such a high precision table provides sufficient accuracy that data from marks at one table position can be used to orient patterns at another table position. It should be noted, however, that the accuracy requirement for the table is only relative and only in a local area corresponding to the chip, as contrasted to a mask maker where absolute table accuracy is required over the range of the most distant chips.

An electron beam exposure system is indicated generally by FIG. 1. An electron beam source 11 produces a beam B which is shaped into various spot shapes and blanked by the deflection and aperture apparatus 12, under the control of spot shaping apparatus, both located in spot shaping, blanking analog electronics unit 14 according to Michail et al. in U.S. Pat. No. 3,900,736. The positioned and shaped spot is controlled, in part, by unit 14 under the control of digital electronics in pattern control section 15. This determines the pattern written in the sub-field under the control of the control computer 16, again according to Michail et al., supra. Pattern control section 15 supplies signals on line 64 to unit 14. The shaped beam is vector positioned by the deflection plates 13 under the control of electrostatic deflection system 33. After each subfield is completed, the next subfield is positioned by the deflection coils 17 under the control of magnetic deflection system 19. Pattern control section 15 supplies signals on line 66 to control magnetic deflection system 19.

After all subfields of the field are exposed, the next field is positioned by motion of the X-Y work table 8 which supports the substrate 7. Measurement system 21 preferably directs a pair of laser beams at mirrors on two edges of the work table 8 to measure table position. The laser beams are omitted from the drawing to minimize confusing detail. Measurement system 21 provides error signals to magnetic deflection system 19. Electronics in the magnetic deflection system 19 provide signals to the deflection coils 17 to compensate for X and Y position errors and for angular errors.

After positioning to a chip location on substrate 7, target height is sensed by the detector 61 and height sense system 62. The detector 61 and height sense system 62 are, for example, according to U.S. Pat. No.

4,468,565 to Blair et al. which generates a signal that represents the target height. The sensed height signal is passed to the control computer 16 via line 66. The control computer 16 compares the sensed height to the desired height and applies corrections, via pattern control section 15, on line 65 to the vector deflection system 33 and on line 66 to the magnetic deflection system 19 to compensate for expected field distortions due to height errors. Next, a registration cycle is initiated. The beam B is deflected to the nominal location of four registration marks on substrate 7, for the field about to be written, and the four areas are scanned by the electron beam.

The actual positions of the registration marks are detected by backscattered electrons which strike detectors 22. The signals from detectors 22 are fed on lines 27 and 28 to the registration detection system 23, which determines the actual mark positions. This information is provided to the control computer 16 by a signal on line 60. The control computer 16 compares the desired field position with the signal on line 60, i.e., the desired field position and the actual position are compared, and deflection corrections are applied on line 65 to the electrostatic deflection system 33 and on line 66 to the magnetic deflection system 19.

The X-axis work table positioning is controlled by an X position signal included in an X/Y position signal on line 24 from control computer 16 to stage position measurement system 21. The signal on line 24 is predetermined by wafer specifications stored in the form of position control data in control computer 16 as modified by current registration signals received via line 60 from registration detection system 23. The actual X position of work table 8 is determined by stage position measurement system 21, and that value is compared to the desired X position signal on line 24 from control computer 16. A resulting position error signal on line 25 is applied to a servo apparatus in the X stage drive mechanism 26 which applies a drive signal to motor 67. The Y-axis work table positioning is similarly controlled by a servo apparatus in the Y stage drive mechanism 35 which responds to a signal on line 34 from the stage position measurement system 21.

In accordance with the invention, chips can be formed by a mosaic of M×N fields, eliminating the E-beam field size constraint upon chip size. In the prior art, as exemplified by the techniques described by Davis, supra, all the registration marks must be contained within the E-beam field. The effective E-beam field was expanded by making the field rectangular in one case and by registering beyond the writing quality portion of the field in the other. But these techniques limit at least one dimension of the chip to about one and a half times the E-beam field. In contrast, the subject invention can use many E-beam fields per chip and has the added advantage that the E beam field can be tailored for optimum performance rather than being "stretched" for chip coverage.

Figure 2:
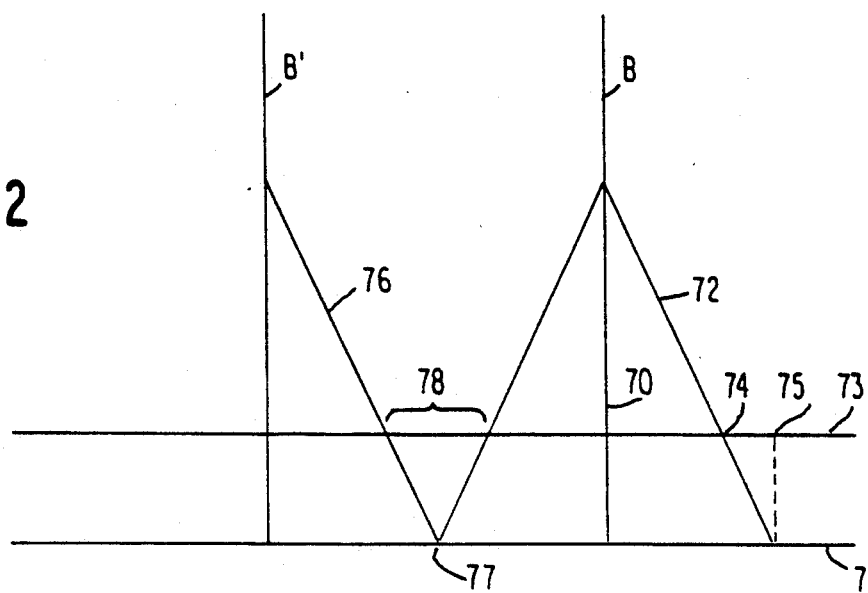
FIG. 2 is a simplified block diagram of the electron beam exposure system shown in FIG. 1 showing the errors due to target height variations.

A significant feature of the invention is compensation for errors due to target height variations; however, before describing the mechanics of height compensation, a brief description, with reference to FIG. 2, of why height is a problem is appropriate. In FIG. 2, the undeflected beam B impinges the target 7 essentially perpendicular. This is illustrated by the electron path 70. To place the beam in other portions of the E-beam field area, the beam B is deflected by changing its angle of travel as indicated by the electron path 72. Because of the deflection angle, the beam will only be displaced the correct distance on a wafer at the nominal height of target 7. For a high wafer surface height 73, the beam will only be displaced to 74, rather than to the designed position 75. For a chip made of multiple E-beam fields, a neighbor E-beam field will be written by the beam deflected as shown by the electron path 76. The fields will be coincident at location 77 on the nominal height of target surface 7 but will have a gap 78 on the high wafer surface 73 creating pattern errors. Also, overlay will be similarly degraded unless by chance the previous level was written with the same height error. Note that while the wafer surface is shown as having a uniform height, real wafers are more nearly "potato chip" or "dome" shaped after "hot" processing so errors at one wafer location are different than at other locations. Also, the traces 72 and 76 are actually spirals, so the E-beam field error has a rotation component as well as magnification. And for many forms of deflection, the beam does not have a single fixed "rocking point" as in this illustrative example.

In the normal four mark registration sequence, the errors described above are detected as miss-positioned marks in the field corners, and normal registration corrections compensate for the errors. But when there are no marks, the error would be undetected in the prior art.

Figure 3:
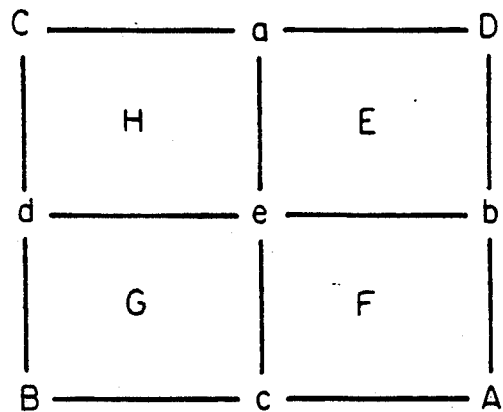
FIG. 3 is a plan view illustrating an example of a chip formed by four fields in a $2 \times 2$ array.

In FIG. 3, a chip is formed by four fields E, F, G, and H, and has marks at locations A, B, C, D, a, b, c, and d, but none at location e. The "3-mark" method according to the invention has two steps. The first step is four table moves which position the locations A, B, C, and D at field center. Mark location and height difference from nominal are detected at center field to eliminate position errors due to non-perpendicular beam landing and to eliminate height errors because of height differences caused by the combination of target tilt and separation between the mark and sensor location. The location and height of the virtual mark at location e is then defined by interpolation of data for marks A, B, C, and D. Step two of the process is exposure similar to the standard four mark registration except that only the three physical marks are sensed per field and the virtual mark at location e is calculated from the data of step one. For example, field E marks a, D and b are detected. The location of the virtual mark at location e is calculated by adjusting its position, as determined in step one, by the expected shift caused by its relative position in field E and the difference in height of the virtual mark at location e and the reference height. Basically, this corrects the position of the virtual mark at position e to the apparent position at which it would have been sensed had there been a real mark at location e. This is the key to the technique according to the subject invention which corrects for the normally unacceptable errors caused by nonperpendicular beam landing. All normal four mark registration corrections are applied to the field during writing for optimal correction, including quadratic corrections to compensate for tilt.

Figure 4:
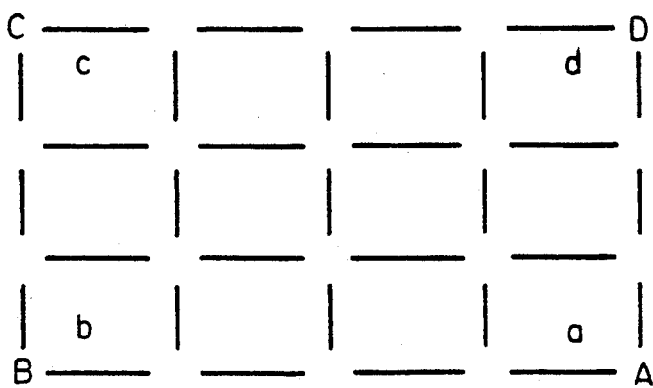
FIG. 4 is a plan view illustrating an example of a chip formed by twelve fields in a $3 \times 4$ array.

FIG. 4 illustrates a chip made of multiple fields and has marks only at locations A, B, C, and D. The real marks do not have to be at field corners. For example, they could be at a, b, c, and d, in which case "virtual" marks A, B, C, and D could be determined by extrapolation. Or they could be a non-rectangular orientation.

The "M×N" method first obtains information from the real marks while they are positioned at field center for the same reasons the "3-mark" method does. Then the location and heights of all field corners are obtained by interpolation. The fields are written based on the interpolated four field corner locations modified by their difference in height from nominal and their location in the field. The modification compensates for non-perpendicular beam landing. The compensated interpolated mark positions are used to calculate the registration terms for writing.

Figure 5:
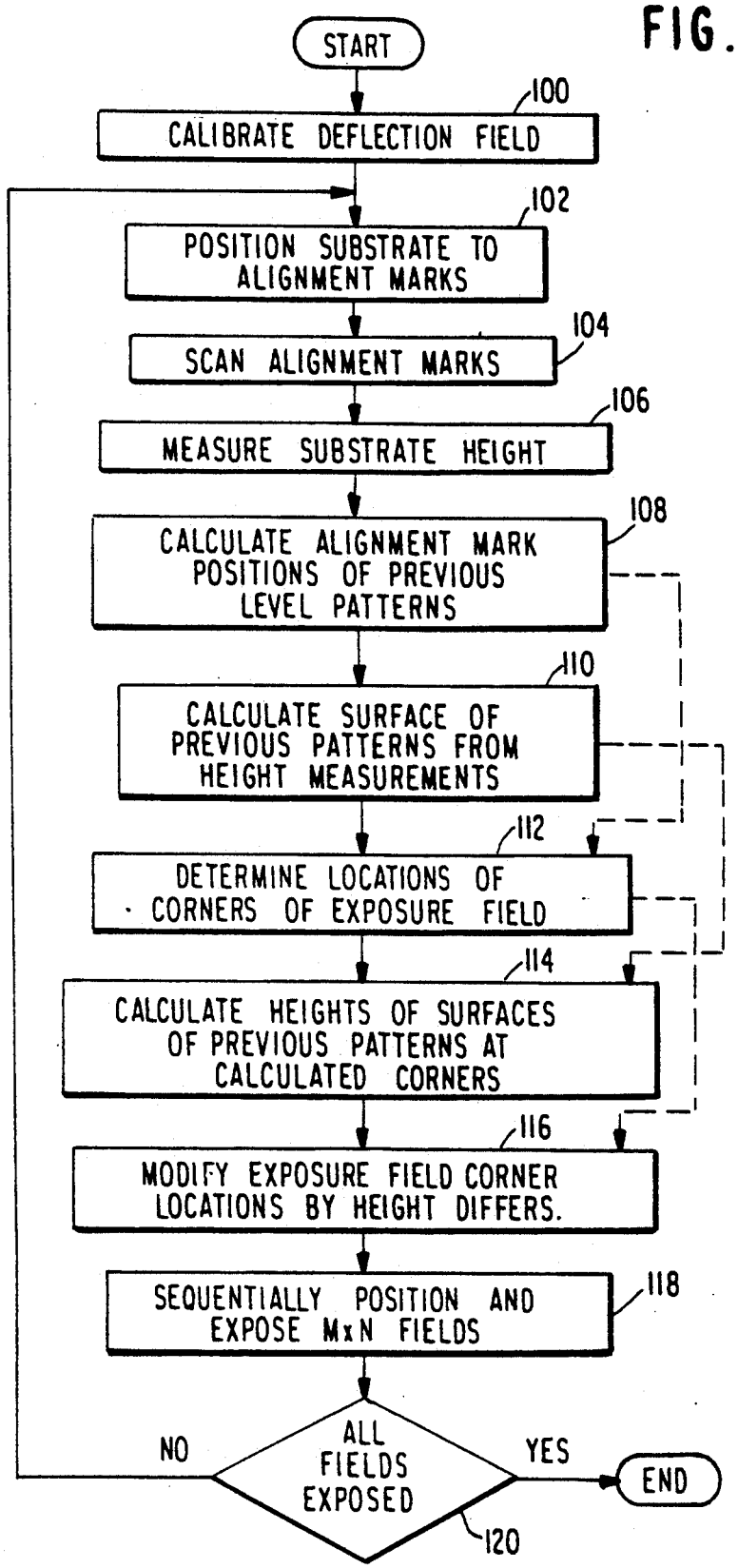
FIG. 5 is a flow chart showing the process according to the invention for the general case of an $M \times N$ array.

The M×N method is illustrated in the flow chart of FIG. 5, to which reference is now made. The process begins in function block 100 by calibrating the deflection field to eliminate relative placement errors of points in the field at a known height. One way to do this is to scan a reference grid at a known height and make suitable deflection adjustments at various points of the field. The number of calibration points is not limited; e.g., there could be thousands of calibration points.

Next, in function block 102, the substrate or target is sequentially positioned to three or more alignment marks associated with the previous level pattern on the substrate. The marks are scanned in function block 104, the positioning being such that each alignment mark can be scanned using a small deflection at the center of the exposure field so as to eliminate positional errors due to height. The substrate height is also measured in function block 106 at three or more locations in the vicinity of the previous level pattern(s).

With the measured data generated in function block 104, an analytical description of the alignment mark positions associated with the previous level pattern(s) is calculated in function block 108. In function block 110, an analytical description of the surface of the previous pattern(s) is calculated from the height measurement data obtained in function block 106. The locations of the corners of the exposure field are calculated in function block 112 based upon the analytical description determined in function block 108. The heights of the surface(s) of the previous pattern(s), relative to the reference grid, at the corners of the exposure field(s) are then calculated in function block 114 from the analytical expression obtained in function block 110. The exposure field corner locations from function block 112 are modified by the height difference from function block 114 and used to form corrections to the exposure field in function block 116 so that the exposure field will overlay the previous pattern on the substrate.

Once the analytical descriptions have been computed by the control computer 16, the substrate 7 is sequentially positioned in function block 118 and a field is exposed. After each exposure, a test is made in decision block 120 to determine if all M×N fields of the substrate have been exposed. If not, the process loops back to function block 102 to repeat until the entire substrate has been exposed.

In the 3-mark method, the process in function blocks 100 through 116 are similar to that just described. The substrate is sequentially positioned to expected exposure locations. Prior to exposure, alignment marks which may exist within scanning reach are scanned to obtain a more accurate identification of the desired position of the exposure field. The scan field modifications from function block 116 are recalculated using actual data for those field corners where marks exist. The field is then exposed with the more accurate corrections. The process in function blocks 102 through 116 is repeated until the entire substrate has been exposed.

If wafer bow is large, errors in height interpolated for the internal marks could be large. In those cases, height could be measured at one or more internal points and used in conjunction with the interpolation of virtual mark height to improve their accuracy and thus lessen the error of their calculated apparent location for the fields.

In summary, two methods according to the invention have been described of writing multi-field patterns which utilize the key concepts of 1) measuring the available real marks at field center in order to minimize errors of position caused by beam landing angle and height errors, 2) calculating the position of virtual marks at the corners of all fields, and 3) calculating registration terms for writing using real marks which are available and virtual marks, corrected for their apparent location based on their position in the field, their height difference from nominal, and the non-perpendicularity of the beam to the target plane. The method according to the invention approaches four mark per field writing accuracy because the primary errors caused by target tilt and height error can be compensated.

While the invention has been described in terms of two preferred embodiments, those skilled in the art will recognize that the invention can be practiced with modification within the spirit and scope of the appended claims. For example, the preferred embodiments have been applied to an E-beam lithography system, but it will be understood that the principles involved are equally applicable to other lithography systems, including but not limited to ion beam systems and optical systems.

Having thus described our invention, what we claim as new and desire to secure by Letters Patent is as follows:

1. A method of aligning and exposing a pattern with a lithography system so that chips larger than a deflection field of the lithography system can be formed by exposing M×N fields by correcting the deflection field to compensate for an orientation of a previous pattern on a substrate and to compensate for errors due to height caused by a beam landing non-perpendicular to a target, said method comprising the steps of:
   a. calibrating said deflection field to eliminate relative placement errors of points in the deflection field;
   b. sequentially positioning said substrate to three or more alignment marks associated with a previous pattern on the substrate;
   c. scanning each alignment mark;
   d. measuring substrate height at three or more locations in the vicinity of at least one previous pattern;
   e. calculating an analytical description of alignment mark positions associated with at least one of said previous pattern;
   f. calculating an analytical description of a surface of said previous pattern from substrate height measurements;
   g. calculating an analytical description of exposure fields based upon the analytical description determined in step (e);
   h. calculating heights of a surface of the previous pattern, relative to a reference grid, at corners of the exposure fields from the analytical expression determined in step (f);
   i. modifying an exposure field corner location data from step (g) based on a height difference from step (h) and using said modified location data to form corrections to the exposure field so that all points of the exposure field are laterally positioned so that they are vertically aligned to their related points of the previous pattern on the substrate;

j. positioning said substrate and exposing said fields; and k. repeating steps (a) through (j) until all M×N fields of the substrate have been exposed.

2. The method of claim 1 wherein step (a) is performed using one or more reference grids at known heights.

3. The method of claim 1 wherein step (c) is performed using a small deflection at a center of an exposure field so as to eliminate positional errors due to height.

4. A method of aligning and exposing a pattern with a lithography system so that chips larger than the deflection field can be formed by exposing M×N fields by correcting the deflection field to compensate for orientation of a previous pattern on a substrate and to compensate for errors due to height caused by a beam landing non-perpendicular to a target, said method comprising the steps of:

a. calibrating said deflection field to eliminate relative placement errors of points in the deflection field;

b. sequentially positioning said substrate to three or more alignment marks associated with a previous pattern on the substrate;

c. scanning each alignment mark using a small deflection at a center of an exposure field so as to eliminate positional errors due to height;

d. measuring substrate height at three or more locations in the vicinity of at least one previous pattern;

e. calculating an analytical description of alignment mark positions associated with at least one of said previous pattern;

f. calculating an analytical description of a surface of said previous pattern from substrate height measurements;

g. calculating an analytical description of exposure fields based upon the analytical description determined in step (e);

h. calculating heights of a surface of the previous pattern, relative to a reference grid, at corners of the exposure fields from the analytical expression determined in step (f);

i. modifying an exposure field corner location data from step (g) based on a height difference from step (h) and using said modified location data to form corrections to the exposure field so that all points of the exposure field are laterally positioned so that they are vertically aligned to their related points of the previous pattern on the substrate;

j. sequentially positioning said substrate to expected exposure locations and, prior to exposure, scanning alignment marks existing within the scanning field to obtain a more accurate identification of the desired position of the exposure field;

k. recalculating scan field modifications from step (i) using actual scan data for those field corners where marks exist;

l. exposing said field with said corrections; and m. repeating steps (b) through (l) until the entire substrate has been exposed.

5. The method of claim 4 wherein M and N are each equal to two.

6. A method of aligning an electron beam exposure system and work pieces with registration marks in preparation for exposure of said work pieces, said work piece having a non-uniform surface height, the method comprising the steps of:

a. positioning of the exposure system over a set of P alignment marks on said work piece;

b. measuring a height of a surface of said work piece relative to said exposure system at Q points on said work piece;

c. employing data from steps (a) and (b) for calculation of constants of equations describing a position and height of any location on said work piece;

d. calculating each electron beam field corner from the results of step (c);

e. calculating height error corrections for field corners based upon said net field corner position errors based upon the result of step (c); and f. employing the results of steps (d) and (e) for calculating the registration parameters for said system so that all points of an exposure field on the work piece will have good lateral positions that are vertically aligned to their related points of a previous exposure field on the work piece.

7. A lithography system that forms chips larger than a deflection field of the lithography system by exposing M×N fields, said lithography system correcting the deflection field to compensate for an orientation of a previous pattern on a substrate and compensating for errors due to height caused by a beam landing non-perpendicular to a target, said lithography system comprising:

calibration means for calibrating said deflection field to eliminate relative placement errors of points in the deflection field;

positioning means for sequentially positioning said substrate to three or more alignment marks associated with a previous pattern on the substrate;

scanning means for scanning each alignment mark using a small deflection at a center of an exposure field so as to eliminate positional errors due to height;

measuring means for measuring substrate height at three or more locations in the vicinity of at least one previous pattern;

control means for calculating an analytical description of alignment mark positions associated with at said least one previous pattern, calculating an analytical description of a surface of said previous pattern from height measurements, calculating an analytical description of a surface of the deflection field, and calculating heights of a surface of the previous pattern, relative to a reference grid, at corners of the exposure field; and exposure means responsive to said control means for modifying exposure field corner location data by a calculated height difference and using said modified location data to form corrections to the exposure field so that all points of the exposure field are laterally positioned so that they are vertically aligned to their related points of the previous pattern on the substrate;

said positioning means sequentially positioning said substrate and exposing said fields until all M×N fields of said substrate have been exposed.

8. A lithography system that forms chips larger than a deflection field of the lithography system by exposing M×N fields, said lithography system correcting the deflection field to compensate for an orientation of a previous pattern on a substrate and compensating for errors due to height caused by a beam landing non-perpendicular to a target, said lithography system comprising:
- calibration means for calibrating said deflection field to eliminate relative placement errors of points in the deflection field at a reference height;
- positioning means for sequentially positioning said substrate to three or more alignment marks associated with a previous pattern on the substrate;
- scanning means for scanning each alignment mark using a small deflection at a center of an exposure field so as to eliminate positional errors due to height;
- measuring means for measuring substrate height at three or more locations in the vicinity of at least one previous pattern;
- control means for calculating an analytical description of alignment mark positions associated with at said least one previous pattern, calculating an analytical description of a surface of said previous pattern from height measurements, calculating an analytical description of a surface of the field, and calculating heights of a surface of the previous pattern from a reference height; and
- exposure means responsive to said control means for modifying the exposure field based on a calculated height difference and using said modified location data to form corrections to the exposure field so that all points of the exposure field are laterally positioned so that they are vertically aligned to their related points of the previous pattern on the substrate;
- said positioning means sequentially positioning said substrate and exposing said fields until all $M \times N$ fields of said substrate have been exposed.

9. The lithography system of claim 8 wherein said control means recalculates the scan field modifications using actual scan data, said exposure means being responsive to said control means for exposing each field with corrections determined by the recalculation.

* * * * *